(12) United States Patent
D'Souza et al.

(10) Patent No.: US 6,514,825 B1
(45) Date of Patent: Feb. 4, 2003

(54) TECHNIQUE FOR REDUCING 1/F NOISE IN MOSFETS

(75) Inventors: Sandeep D'Souza, Costa Mesa; Li-Ming Hwang, Irvine; Aniruddha Joshi, Irvine; Suryanarayana Shivakumar Bhattacharya, Irvine, all of CA (US)

(73) Assignee: Conexant Systems, Inc., Newport Beach, CA (US)

(*) Notice: Subject to any disclaimer, the term of this patent is extended or adjusted under 35 U.S.C. 154(b) by 9 days.

(21) Appl. No.: 09/606,778

(22) Filed: Jun. 28, 2000

(51) Int. Cl.[7] .................... H01L 21/336; H01L 21/469
(52) U.S. Cl. .................. 438/287; 438/766; 438/770; 438/786
(58) Field of Search ................. 438/981, 275, 438/255, 287, 407, 526, 770, 775, 458; 257/369, 325

(56) References Cited

U.S. PATENT DOCUMENTS

| | | | | |
|---|---|---|---|---|
| 4,866,498 A | * | 9/1989 | Myers | 357/30 |
| 5,596,218 A | * | 1/1997 | Soleimani et al. | 257/369 |
| 5,811,339 A | | 9/1998 | Tseng | |
| 5,908,312 A | * | 6/1999 | Cheung et al. | 438/287 |
| 6,049,104 A | | 4/2000 | Hshieh et al. | |
| 6,051,468 A | | 4/2000 | Hshieh | |
| 6,060,369 A | * | 5/2000 | Gardner et al. | 438/407 |
| 6,133,164 A | * | 10/2000 | Kim | 438/981 |
| 6,140,167 A | * | 10/2000 | Gardner et al. | 438/197 |
| 6,146,979 A | * | 11/2000 | Henley et al. | 438/458 |
| 6,180,543 B1 | * | 1/2001 | Yu et al. | 437/787 |

OTHER PUBLICATIONS

Article entitled 1/f Noise Characterization of Deep Sub–Micron Dual Thickness Nitrided Gate Oxide n– and p–MOSFETs, by Sandeep D'Souza et al., pp. 1–4, Dec. 1999.
Article entitled "Simultaneious Growth of Different Thickness Gate Oxides in Silicon CMOS Processing", by Brian Doyle et al., IEEE Electron Device Letters, vol. 16, No. 7, pp. 301–302, Jul. 1995.

* cited by examiner

*Primary Examiner*—Michael Lebentritt
(74) *Attorney, Agent, or Firm*—Thomas, Kayden, Horstemeyer & Risley, LLP

(57) ABSTRACT

An improved gate structure for a MOSFET device exhibits a reduced level of 1/f noise or "flicker noise", while maintaining the control of boron penetration into the substrate of the MOSFET device. The gate structure for the MOSFET device includes a gate electrode and a gate oxide layer wherein nitrogen is selectively implanted into the gate oxide/device substrate interface prior to oxidation of the gate oxide layer. The nitrogen is selectively implanted so that the nitrogen is implanted into thin gate oxide regions and masked from thick gate oxide regions so that the benefits of controlling the boron penetration are realized while the 1/f noise is reduced due to the selective implantation of the nitrogen.

8 Claims, 9 Drawing Sheets

|  | Nitrogen implant | Nitriding ambient | SiO$_2$ |
|---|---|---|---|
| Mean V$_{th}$ (V) | -0.595 | -0.552 | -0.461 |
| V$_{th}$ Spread (mV) | 2 | 17 | 15 |

500 — Nitrogen implant
510 — Nitriding ambient
520 — SiO$_2$

FIG. 5

TECHNIQUE FOR REDUCING 1/F NOISE IN MOSFETS

BACKGROUND OF THE INVENTION

1. Technical Field

The present invention relates generally to microelectronic circuits. More specifically, the present invention relates to reducing 1/f noise in Metal Oxide Semiconductor Field Effect Transistor (MOSFET) devices.

2. Background Information

Nitrided oxides are commonly used as gate dielectrics in submicron Complementary Metal-Oxide Semiconductor (CMOS) technologies due to the nitrogen's ability to control boron penetration from the p+ doped polycrystalline silicon into the channel region of the MOSFET device. The control of boron penetration is critical in establishing and maintaining a uniform and stable value of threshold voltage (Vth) for the MOSFET device. Changes in the boron penetration produce fluctuations in the threshold voltage which impact the performance of the device. It is critical that the MOSFET device has a predictable threshold voltage so that the device can be accurately matched to the required specifications. In a dual gate thickness CMOS process technology, where thin and thick gate oxides for MOSFET devices are formed, boron penetration is generally only a problem for thin gate oxide MOSFETs.

Unfortunately, nitrided oxides introduce some undesirable side effects. The use of nitrided oxides significantly increases the 1/f noise or "flicker noise" in MOSFETs through an introduction of oxide charges and traps. For example, referring now to FIG. 1A, the noise measurement of a n-channel thick gate oxide MOSFET fabricated with and without nitrided oxide, is plotted over a range of 1–10000 Hz. Noise measurement 100 corresponds to a n-channel MOSFET fabricated with pure oxide (i.e., without nitrogen) and noise measurement 110 corresponds to a n-channel MOSFET fabricated with nitrided oxide. As can be seen by the graph in FIG. 1A, nitridation increases 1/f noise by approximately 5.3 dB over the corresponding NFET device grown in silicon dioxide (SiO2) without nitrogen. Similarly, referring now to FIG. 1B, noise measurement 150 corresponds to a p-channel thick gate oxide MOSFET fabricated with pure oxide and noise measurement 160 is for the corresponding p-channel MOSFET fabricated with nitrided oxide. In this case, nitridation causes a 1/f noise increase of 13.7 dB for a buried channel PFET. These levels of 1/f noise are particularly unattractive for analog/RF circuit applications due to the impact upon key circuit metrics such as noise figure and oscillator phase noise.

Vertical High Pressure (VHP) nitridation followed by reoxidation to push nitrogen away from the silicon-oxide interface has been tried as a method for reducing 1/f noise, while maintaining the benefit of controlling boron penetration. However, VHP nitridation requires the use of a very high pressurized reacting chamber that is very expensive to utilize in a manufacturing process. Further, VHP nitridation is hard to implement because of safety reasons.

Therefore, a technique for controlling boron penetration is thus needed which overcomes the shortcomings of the prior art.

SUMMARY OF THE INVENTION

A method of forming a gate for a MOSFET device in accordance with the present invention utilizes a process of implanting nitrogen into the device substrate proximate the gate. The nitrogen implant process provides the benefit of controlling boron penetration into the channel regions of thin gate MOSFET devices while reducing the amount of 1/f noise in thick gate MOSFET devices. Thus, a practical embodiment may be realized in a cost efficient manner.

The above and other features of the present invention may be carried out in one form by forming a sacrificial oxide layer on a semiconductor substrate using thermal oxidation. A photoresist pattern is then defined so as to expose regions where thin gate oxide will eventually be formed. Next, nitrogen is selectively implanted into the thin gate regions so that it penetrates the semiconductor substrate. The photoresist and sacrificial oxide layer are then etched to expose the underlying semiconductor substrate layer. A gate oxide layer is then formed from an upper portion of the substrate layer. Next, a polysilicon layer is formed on the gate oxide layer, and then the polysilicon layer is patterned and etched to form a gate electrode.

BRIEF DESCRIPTION OF THE DRAWINGS

A more complete understanding of the present invention may be derived by referring to the detailed description and claims when considered in connection with the following illustrative Figures, which may not be to scale. In the following Figures, like reference numbers refer to similar elements throughout the Figures.

FIG. 5 is a table depicting the threshold voltage spread for several surface channel p-MOSFETs.

DETAILED DESCRIPTION

The present invention may be described herein in terms of various hardware components and processing steps. It should be appreciated that such components may be realized by any number of hardware components configured to perform the specified functions. For example, the present invention may employ various integrated circuit components, e.g., transistors, memory elements, digital signal processing elements, integrators, and the like, which may carry out a variety of functions under the control of one or more microprocessors or other control devices. In addition, those skilled in the art will appreciate that the present invention may be practiced in any number of field effect transistor contexts and that the preferred embodiment described herein is merely one exemplary application for the invention. Accordingly, the present invention is not limited to the process flows described herein, as any process flow or rearrangement of process steps which captures the features of the present invention is considered to be within the scope of the present invention. Further, it should be noted that the present invention may employ any number of conventional techniques for processing steps such as photolithography, and the like. Such general techniques that may be known to those skilled in the art are not described in detail herein.

It should be appreciated that the particular implementations shown and described herein are merely illustrative and are not intended to limit the scope of the present invention in any way. Indeed, for the sake of brevity, conventional processing techniques may not be described in detail herein. For example, the process of photolithography patterning and etching is used herein in describing certain process steps in the present invention, but the process of photolithography itself, as carried out in the present invention, is not described in detail. The photolithography process includes creating a photomask containing the pattern of the component to be formed on a substrate, coating the substrate with a radiation-sensitive compound also known as a photoresist, exposing the photoresist layer to ultraviolet radiation through the mask, removing the softened portions of the photoresist, etching to remove the material left unprotected by the photoresist, and stripping off the remaining photoresist. Those skilled in the art will understand this as the process that occurs when a photolithography step is included when describing the present invention.

As previously discussed above, a need exists for a MOSFET device that has a reduced 1/f noise and the ability to control boron penetration into the channel region, and yet is cost-effective to manufacture. In accordance with the present invention, a MOSFET device is suitably configured to control boron penetration and to reduce the 1/f noise associated with the MOSFET device.

Figure 1A:
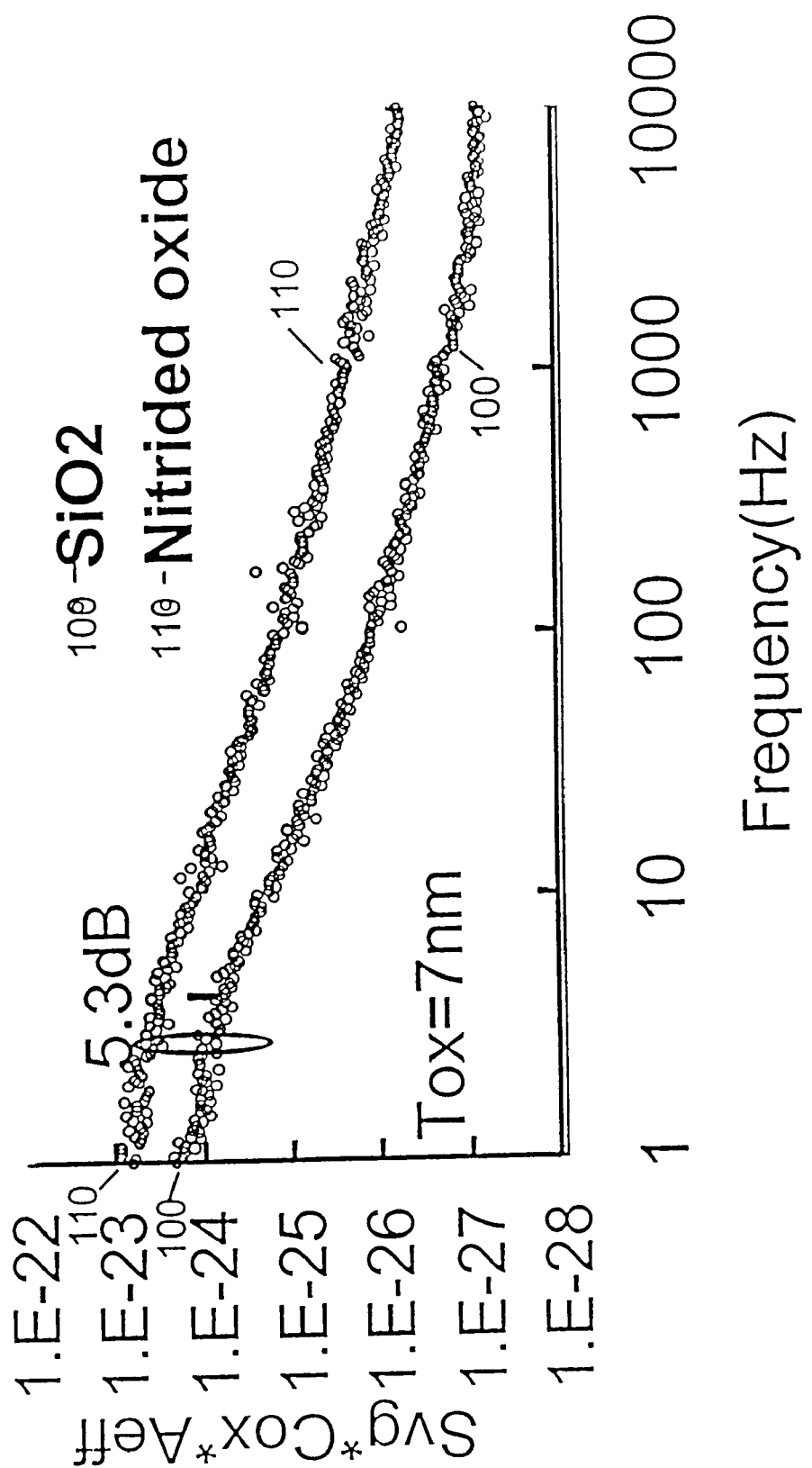
FIG. 1A illustrates a graph of the 1/f noise for a n-channel MOSFET fabricated with and without nitridation of the gate oxide layer.
Figure 1B:
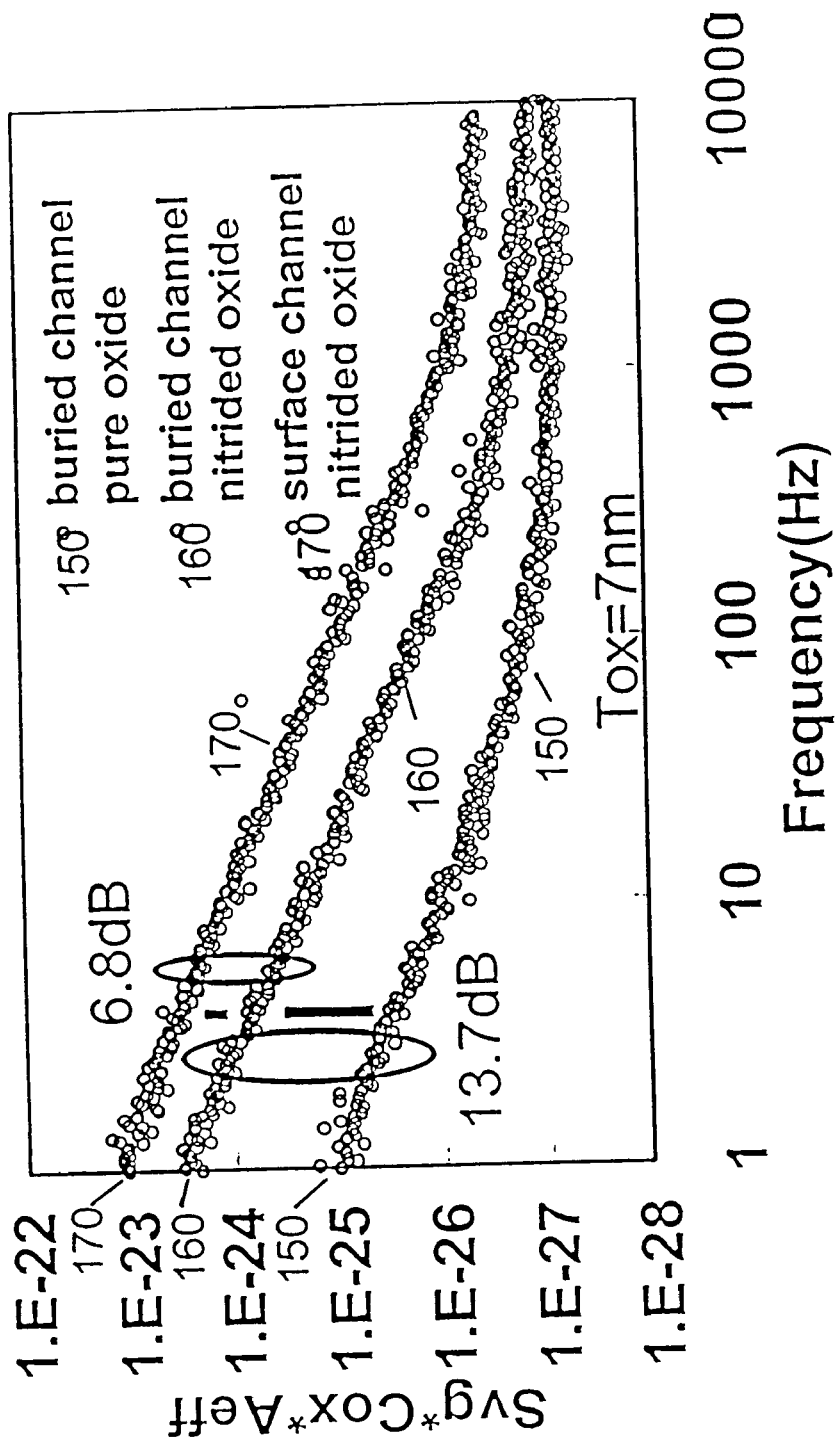
FIG. 1B illustrates a graph of the 1/f noise for a p-channel MOSFET fabricated with and without nitridation of the gate oxide layer.
Figure 2:
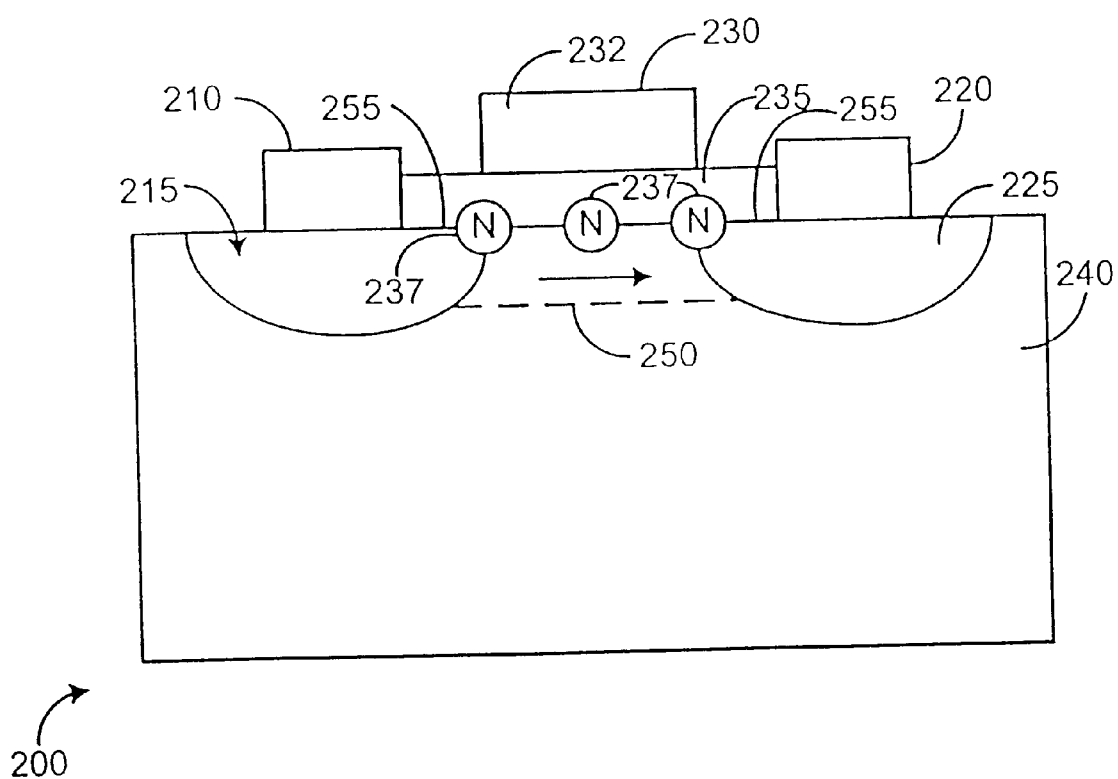
FIG. 2 illustrates, in cross-section, a n-channel MOSFET in accordance with the present invention.

In accordance with an exemplary embodiment of the present invention, with reference to FIG. 2, an n-channel MOSFET or n-MOSFET device 200 is illustrated. Although the present invention may be used in conjunction with n-channel MOSFETS or p-channel MOSFETS, the present invention is conveniently described below in connection with n-channel MOSFETS. The structure and processing techniques described also apply to p-channel MOSFETS.

In accordance with this embodiment, n-MOSFET 200 suitably comprises a p-type semiconductor substrate 240 in which two regions 215 (n-type source region) and 225 (n-type drain region) and a channel 250 are formed by a source 210, a drain 220, and a gate 230. The basic configurations and features of these components are known to those skilled in the art. Accordingly, the fundamental operation of these components will not be described in detail herein.

Gate 230 preferably comprises a gate electrode 232, and a gate oxide layer 235 with nitrogen 237 selectively implanted within gate oxide layer 235 and p-type semiconductor substrate 240. As will be described below, nitrogen 237 is selectively implanted so that it is proximate the interface 255 between gate oxide layer 235 and p-type substrate 240. Interface 255 also corresponds to the upper surface of p-type substrate 240. Gate electrode 232 may comprise heavily doped polysilicon, or a combination of silicide (e.g., $WSi_2$) and polysilicon, or the like. Gate oxide layer 235 may comprise silicon dioxide or a similar material.

Figure 3A:
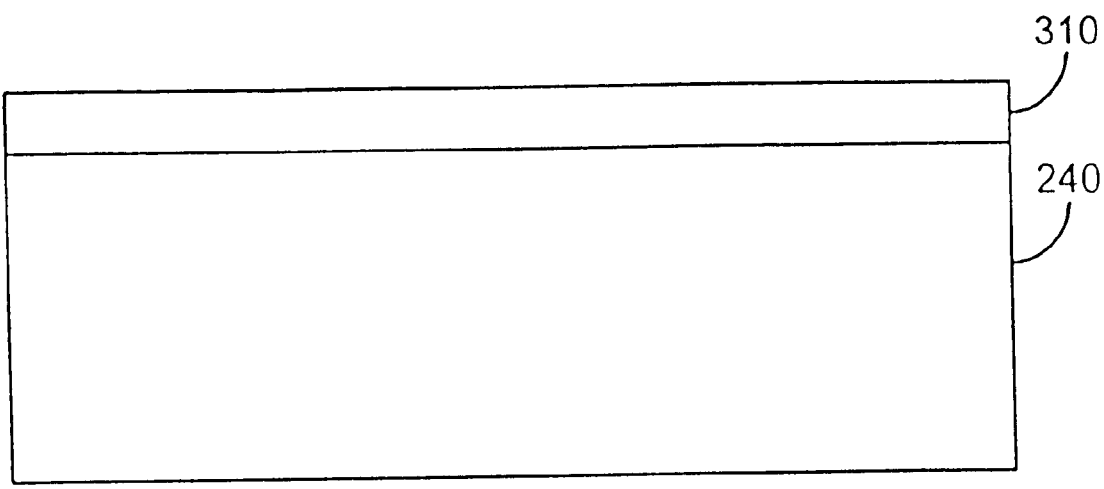
FIGS. 3A–3E illustrate, in cross-section, the gate portion of the n-channel MOSFET of FIG. 2 during various process steps of fabricating the gate.

The method of forming gate 230 with selectively implanted nitrogen 237 will be described next. Referring now to FIG. 3A, initially, a sacrificial oxide layer 310 is formed on semiconductor substrate 240 using methods commonly known in the art such as thermal oxidation. Sacrificial oxide layer 310 is formed on substrate 240 to a thickness in the range of 10 to 30 nanometers with a preferred thickness of approximately 10 nanometers. Sacrificial oxide layer 310 may comprise silicon dioxide or a similar material. In this embodiment, sacrificial oxide layer 310 is formed above the region in which the actual gate is later formed.

Figure 3B:
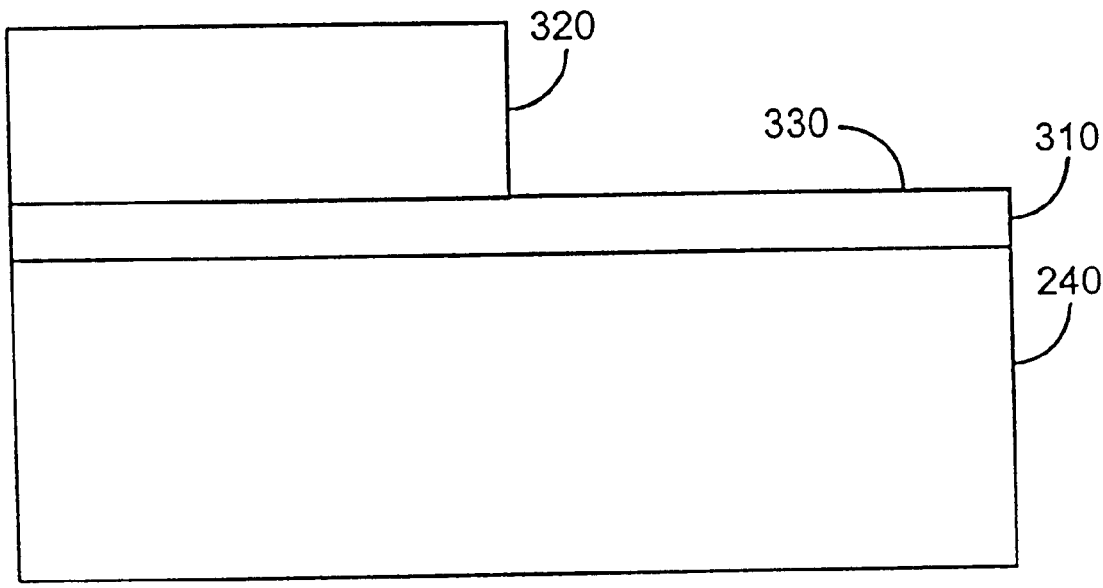

Next, the sacrificial oxide layer is masked using the above-mentioned process of photolithography to form a region for implanting the nitrogen. Referring now to FIG. 3B, a photomask 320 is used to selectively mask sacrificial oxide layer 310 so that a gate region 330 may be patterned on sacrificial oxide layer 310.

Figure 3C:
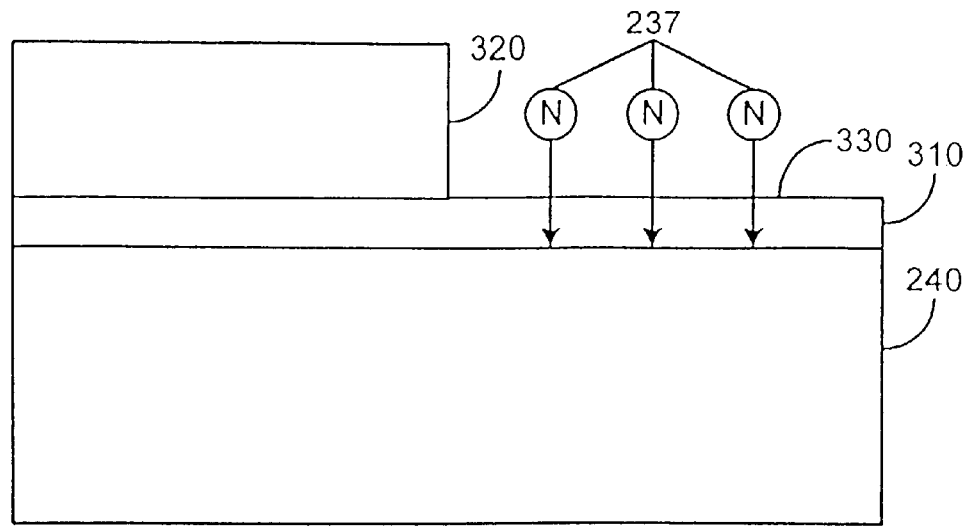

Referring now to FIG. 3C, nitrogen 237 is selectively implanted into gate region 330. As previously discussed, boron penetration is a problem for thin gate oxide MOSFETs, and is generally not a problem for thick gate oxide MOSFETs. Thin and thick gate oxide MOSFETs will be described in more detail below. In accordance with this embodiment of the present invention, nitrogen 237 can be selectively implanted into the gate regions of the thin gate oxide MOSFETs, and not implanted into the gate regions of the thick gate oxide MOSFETs. This can be accomplished by forming gate regions for implanting the nitrogen into the thin gate oxide regions, while masking the thick gate oxide regions, by the process of photolithography as previously discussed. The masking of the thick gate oxide regions will prevent nitrogen from being implanted into those regions.

The implant energy of the nitrogen is in the range of 15 keV to 25 keV and is preferably 20 keV. The nitrogen dose can range from $5.0 \times 10^{14}$ $cm^{-2}$ to $9.0 \times 10^{14}$ $cm^{-2}$ with a preferred dose of $5.0 \times 10^{14}$ $cm^{-2}$. The implant energy and dose is selected so that the peak of the nitrogen implant penetrates substrate 240, but is positioned proximate, for example within 5 nanometers, of the interface between sacrificial oxide layer 310 and substrate 240.

Figure 3D:
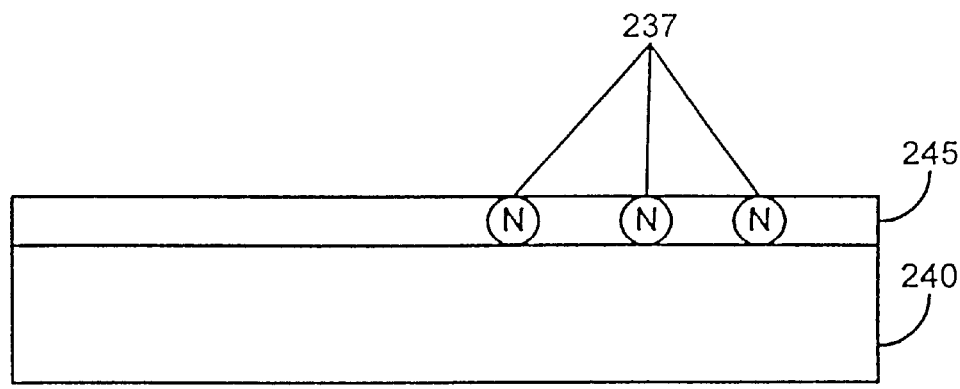

The sacrificial oxide layer is now etched using known techniques such as wet HF dip to expose the substrate below. Referring to FIG. 3D, semiconductor substrate 240 is illustrated with nitrogen 237 implanted into substrate 240. The amount and size of the nitrogen implants 237 is for illustration purposes only, and is not intended to represent the actual amount or size of the nitrogen implants.

Figure 3E:
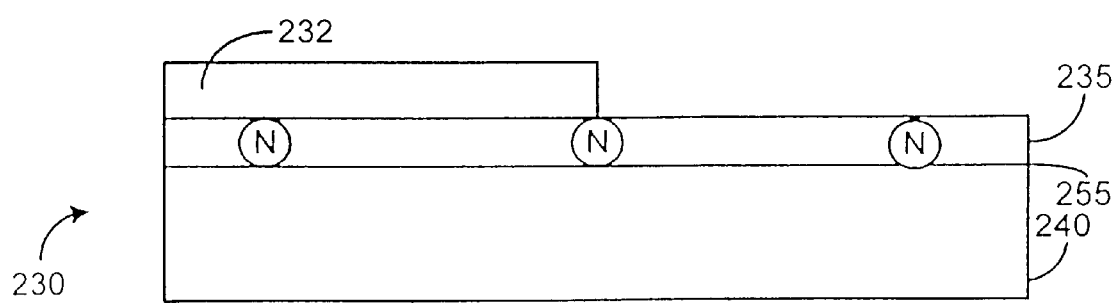

Referring now to FIGS. 3D and 3E, gate oxide layer 235 is now formed from an upper portion 245 of substrate 240. The size of upper portion 245 may vary depending on the thickness of the gate oxide layer as described below. Oxidation of upper portion 245 can now take place in accordance with well known techniques such as thermal oxidation. As illustrated in FIG. 3E, nitrogen may be positioned within gate oxide layer 235. It will be appreciated that it is not necessary to perform nitridation of the gate oxide as nitrogen has already been added by nitrogen implants as described above. In this step, the ability of nitrogen to suppress the oxidation rate can be used in a dual gate thickness CMOS process technology to grow thin and thick gate oxides through a single gate oxidation step. In this embodiment, a high-voltage thick gate oxide is approximately 7 nanometers thick, and a low-voltage thin gate oxide ranges from approximately 2.2 nanometers to 4 nanometers. As it is well known in the art, high-voltage thick gate oxide MOSFETs are utilized for circuits that require a large signal swing such as input/output stages and high gain amplifiers, while low-voltage thin gate oxide MOSFETs are utilized for high-speed applications. It will be appreciated that this dual gate thickness CMOS process technology offers advantages for system on a chip designs such as those designs that integrate radio frequency (RF), analog and digital circuits.

Standard process techniques can now be used to form gate electrode 232 on gate oxide layer 235. One technique is performed by forming a polysilicon layer on the gate oxide layer, and then patterning and etching the polysilicon layer to form the gate electrode.

Figure 4A:
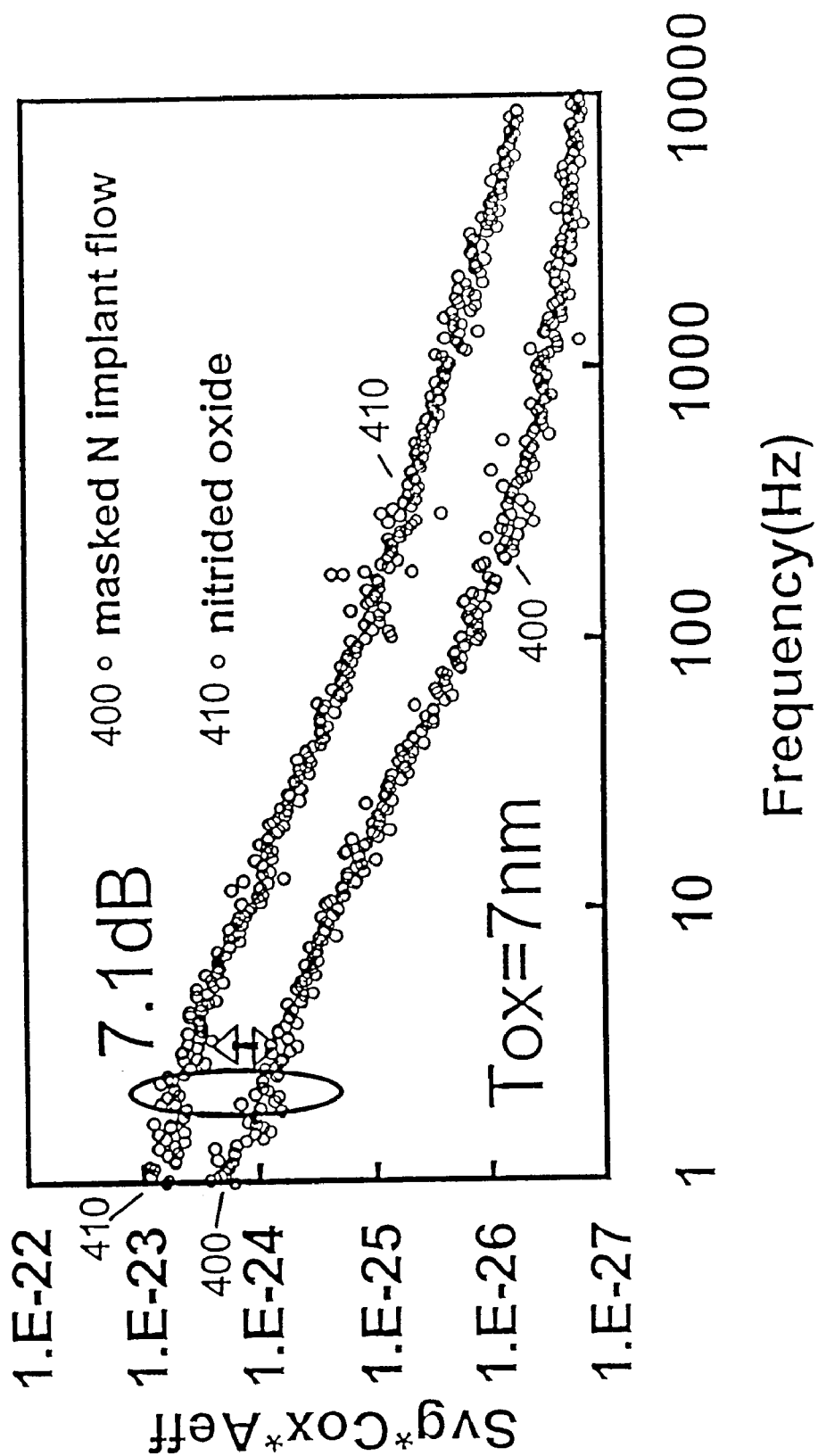
FIG. 4A is a graph depicting the 1/f noise measurement for two n-channel MOSFETs.
Figure 4B:
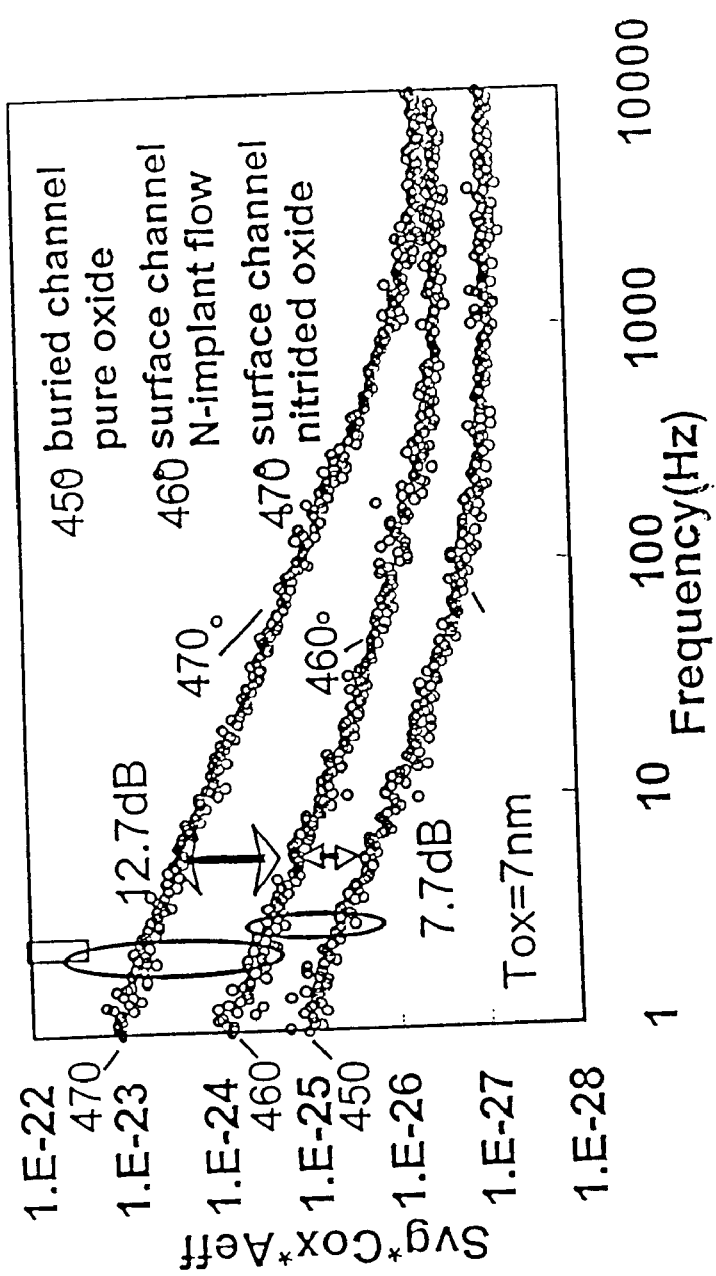
FIG. 4B is a graph depicting the 1/f noise measurement for two p-channel MOSFETs.

Referring now to FIGS. 4A and 4B, graphs illustrate the measurement of 1/f noise for thick gate oxide (i.e., approximately 7 nanometers thick) n-channel MOSFET (FIG. 4A) and a p-channel MOSFET (FIG. 4B) fabricated with different techniques. The graphs illustrate the noise measurement over a frequency range of 1–10000 Hz for a MOSFET fabricated with nitrogen implants in accordance with the present invention compared to the 1/f noise for the corresponding device fabricated with nitridation of the gate oxide. FIG. 4A illustrates the noise measurement 400 for a n-channel MOSFET fabricated with nitrogen implants compared to the noise measurement 410 for the corresponding device fabricated with nitrided oxide. Similarly, FIG. 4B illustrates the noise measurement 460 for a p-channel MOSFET fabricated with nitrogen implants compared to the noise measurement 470 for the corresponding device fabricated with nitrided oxide. For the devices corresponding to noise measurements 400 and 460, nitrogen has been selectively implanted into the thin gate oxide regions, while nitrogen has been masked from the thick gate oxide regions as previously described. As shown on the graphs, the n-channel MOSFET fabricated with nitrogen implants provides for a 1/f noise reduction of 7.1 dB as compared to conventional nitridation techniques. Similarly, the p-channel MOSFET fabricated with nitrogen implants provides for a 1/f noise reduction of 12.7 dB. These measurements were obtained for a dual thickness gate oxide process as described in the article "1/f Noise Characterization of deep sub-micron Dual Thickness Nitrided Gate Oxide n- and p-MOSFETs", 0-7803-5413-3, December 1999 IEEE, by Sandeep D'Souza et al. (co-inventors of the present invention), and hereby incorporated by reference.

Referring now to FIG. 5, the threshold voltage spread for a thin gate oxide surface channel p-MOSFET fabricated by three different process techniques is illustrated. Column 500 illustrates the voltage spread for a MOSFET fabricated with nitrogen implants in accordance with the present invention. Column 510 illustrates the voltage spread for a p-MOSFET fabricated with the prior art technique of nitridation of the gate oxide. Column 520 illustrates a p-MOSFET fabricated with pure oxide (i.e., there is no nitrogen in the gate oxide). It will be appreciated that the tight threshold voltage distribution (i.e., $V_{th}$ spread) of 2 millivolts for column 500 implies that Boron penetration is under control for the thin gate oxide regions of the p-MOSFET fabricated with nitrogen implants.

Figure 6:
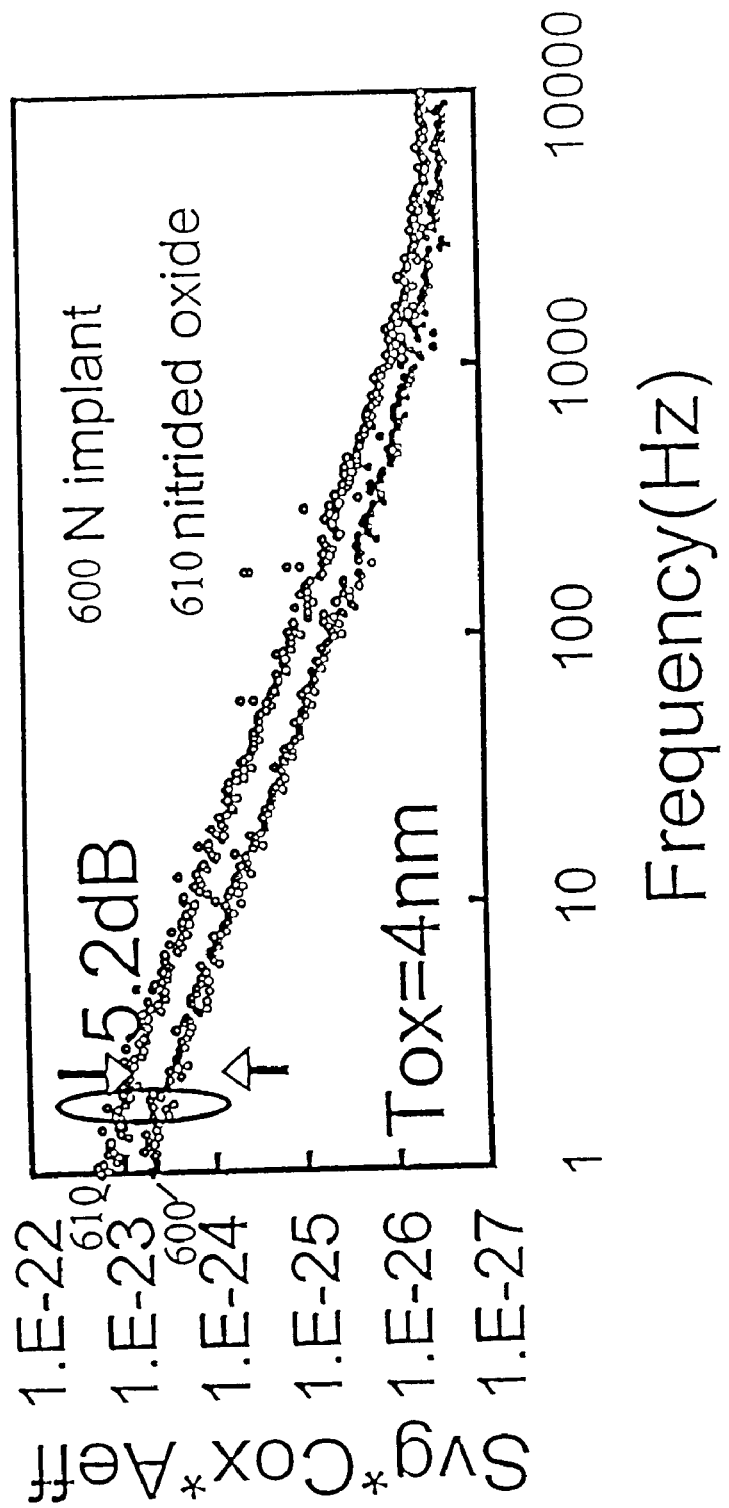
FIG. 6 is a graph depicting the 1/f noise measurement for two thin gate oxide p-MOSFETs.

Referring now to FIG. 6, a graph is illustrated that shows the 1/f noise measurements for a thin gate oxide (i.e., approximately 4 nanometers thick) surface channel p-MOSFET. The graph illustrates the noise measurement 600 for a thin gate oxide p-channel MOSFET fabricated with nitrogen implants compared to the noise measurement 610 for the corresponding device fabricated with nitrided oxide. For the device corresponding to noise measurement 600, nitrogen has been selectively implanted into the thin gate oxide region. As shown on the graphs, the thin gate oxide p-channel MOSFET fabricated with nitrogen implants provides for a 1/f noise reduction of 5.2 dB as compared to conventional nitridation techniques for thin gate oxide MOSFETs.

The present invention has been described above with reference to a preferred embodiment. However, those skilled in the art will recognize that changes and modifications may be made to the preferred embodiment without departing from the scope of the present invention. For example, the various processing steps of forming the gate of the MOSFET may be implemented in alternate ways depending upon the particular application or in consideration of any number of cost functions associated with the operation of the system. In addition, the techniques described herein may be extended or modified for use with various other applications, such as, for example, a mixed signal design in advanced CMOS technologies. These and other changes or modifications are intended to be included within the scope of the present invention.

What is claimed is:

1. A method of forming a gate for a MOSFET device on a semiconductor substrate comprising the steps of:

forming a sacrificial oxide layer on the semiconductor substrate;

masking a pattern to form a thin gate region on the sacrificial oxide layer;

selectively implanting nitrogen with a dosage of approximately $5.0 \times 10^{14}$ cm$^{-2}$ –$9.0 \times 10^{14}$ cm$^{-2}$ into the thin gate region so that the implanted nitrogen is positioned within the semiconductor substrate;

etching the sacrificial oxide layer to expose an upper portion of the semiconductor substrate;

forming a gate oxide layer from the exposed upper portion of the semiconductor substrate;

forming a polysilicon layer on top of the gate oxide layer; and masking and etching the polysilicon layer to form a gate electrode.

2. The method of claim 1, wherein in the step of forming a sacrificial oxide layer, the oxide layer comprises silicon dioxide.

3. The method of claim 1, wherein in the step of forming a sacrificial oxide layer, the sacrificial oxide layer is formed to have a thickness of approximately 10–30 nanometers.

4. The method of claim 1, wherein the step of selectively implanting nitrogen comprises selectively implanting nitrogen with an energy of approximately 15 keV–25 keV.

5. The method of claim 1, wherein the step of selectively implanting nitrogen comprises selectively implanting nitrogen within approximately 5 nanometers of the sacrificial oxide layer.

6. The method of claim 1, wherein the step of forming a gate oxide layer comprises forming a gate oxide layer from an upper portion of the semiconductor substrate.

7. The method of claim 1, wherein in the step of forming a gate oxide layer, the gate oxide layer has a thickness of approximately 2.2–4 nanometers.

8. A gate for a MOSFET device made in accordance with the method of claim 1.

* * * * *